United States Patent
Gong et al.

(10) Patent No.: US 11,983,619 B2
(45) Date of Patent: May 14, 2024

(54) TRANSFORMER NEURAL NETWORK IN MEMORY

(71) Applicant: Micron Technology, Inc., Boise, ID (US)

(72) Inventors: Jing Gong, Boise, ID (US); Stewart R. Watson, Boise, ID (US); Dmitry Vengertsev, Boise, ID (US); Ameya Parab, Millburn, NJ (US)

(73) Assignee: Micron Technology, Inc., Boise, ID (US)

(*) Notice: Subject to any disclaimer, the term of this patent is extended or adjusted under 35 U.S.C. 154(b) by 611 days.

(21) Appl. No.: 16/994,302

(22) Filed: Aug. 14, 2020

(65) Prior Publication Data
US 2022/0051078 A1    Feb. 17, 2022

(51) Int. Cl.
| | |
|---|---|
| *G06N 3/049* | (2023.01) |
| *G06N 3/065* | (2023.01) |
| *G06N 3/084* | (2023.01) |
| *G06N 5/046* | (2023.01) |
| *G11C 13/00* | (2006.01) |
| *H03M 1/12* | (2006.01) |

(52) U.S. Cl.
CPC ............ *G06N 3/049* (2013.01); *G06N 3/065* (2023.01); *G06N 3/084* (2013.01); *G06N 5/046* (2013.01); *G11C 13/0002* (2013.01); *H03M 1/12* (2013.01)

(58) Field of Classification Search
CPC ...... G06N 3/049; G06N 3/0635; G06N 3/084; G06N 5/046; G06N 3/0454; G11C 13/0002; G11C 2213/77; G11C 13/003; G11C 13/0069; G11C 11/54; H03M 1/12
See application file for complete search history.

(56) References Cited

U.S. PATENT DOCUMENTS

| | | | |
|---|---|---|---|
| 10,217,512 B1 * | 2/2019 | Leobandung | G11C 7/16 |
| 10,825,536 B1 * | 11/2020 | Yang | G11C 17/16 |
| 2015/0339570 A1 | 11/2015 | Scheffler | |
| 2017/0228345 A1 | 8/2017 | Gupta et al. | |
| 2018/0276539 A1 * | 9/2018 | Lea | G06N 3/045 |
| 2018/0341860 A1 | 11/2018 | Shazeer et al. | |
| 2019/0129934 A1 * | 5/2019 | Kadav | G06F 3/0604 |
| 2019/0164046 A1 * | 5/2019 | Song | G06N 3/063 |
| 2020/0090035 A1 | 3/2020 | Thathachar et al. | |
| 2020/0104681 A1 | 4/2020 | Li et al. | |

(Continued)

OTHER PUBLICATIONS

Chi et al., "PRIME: A Novel Processing-in-memory Architecture for Neural Network Computation in ReRAM-based Main Memory," in ACM/IEEE 43 Ann. Symp. Computer Architecture 27-39 (2016). (Year: 2016).*

(Continued)

*Primary Examiner* — Ryan C Vaughn
(74) *Attorney, Agent, or Firm* — Brooks, Cameron & Huebsch, PLLC

(57) ABSTRACT

Apparatuses and methods can be related to implementing a transformer neural network in a memory. A transformer neural network can be implemented utilizing a resistive memory array. The memory array can comprise programmable memory cells that can be programed and used to store weights of the transformer neural network and perform operations consistent with the transformer neural network.

18 Claims, 9 Drawing Sheets

(56) References Cited

U.S. PATENT DOCUMENTS

2020/0226201 A1* 7/2020 Ma .................... G06N 3/063
2021/0019606 A1* 1/2021 Yang .................. G06T 1/60

OTHER PUBLICATIONS

Ashish Vaswani et al., 'Attention Is All You Need', In: 31st Conference on Neural Information Processing Systems (NIPS 2017), Dec. 2017 sections 3-5.
International Search Report and Written Opinion from related PCT Application No. PCT/US2021/040077, dated Oct. 21, 2021, 11 pages.
Alammar, Jay, "The Illustrated Transformer", Jun. 27, 2018, (22 pgs.), Blog of Jay Alammar, retrieved from http://jalammar.github.io/illustrated-transformer/.
Budhiraja, Amar, "Dropout in (Deep) Machine Learning", Dec. 15, 2016, (4 pgs.), Medium, retrieved from https://medium.com/@amarbudhiraja/https-medium-com-amarbudhiraja-learning-less-to-learn-better-dropout-in-deep-machine-learning-74334da4bfc5.

* cited by examiner

TRANSFORMER NEURAL NETWORK IN MEMORY

TECHNICAL FIELD

The present disclosure relates generally to memory, and more particularly to apparatuses and methods associated with implementing a transformer neural network in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications including, but not limited to, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
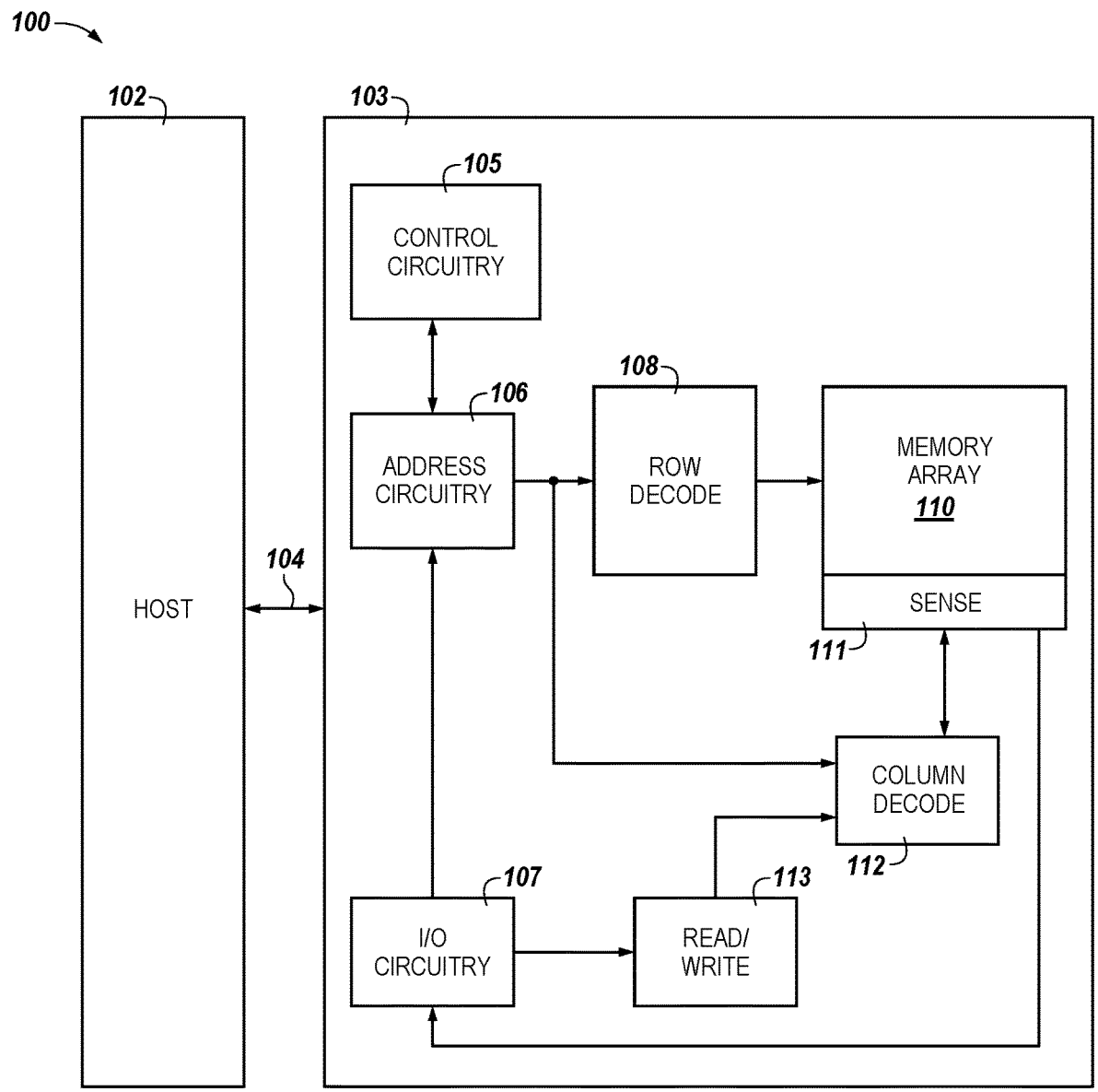
FIG. 1 is a block diagram of an apparatus in the form of a computing system including a memory device in accordance with a number of embodiments of the present disclosure.

The present disclosure includes apparatuses and methods related to implementing a transformer neural network in memory. A transformer neural network can be implemented in memory utilizing resistive memory arrays. The resistive memory array can comprise resistive memory cells. The resistive memory cells can be utilized to perform computations used to implement a transformer neural network.

As used herein, a transformer neural network is a neural network architecture used to transform one sequence into a different sequence utilizing encoders and decoders and utilizing an attention mechanism. Attention mechanisms identify relevant context from a number of inputs. The attention mechanisms are implemented utilizing an attention layer of the transformer neural network. Transformer neural networks can be utilized in various fields such as natural language processing. Natural language processing can include tasks such as spell checking, keyword searches, information extraction from websites, classifying text, machine translation, and spoken dialog system, among other tasks. However, traditional implementation of transformer neural networks can be prone to slow inference as compared to sequence modeling. Traditional implementations of transformer neural networks can comprise the transformer neural network being implemented by the host. The host can request weight values (e.g., weights) from a memory device. The host may process inputs utilizing the weight values. However, the host may be limited to processing the inputs serially which may limit the speed at which the transformer neural network is implemented.

Aspects of the present disclosure address the above and other deficiencies. For instance, a transformer neural network can be implemented in a memory device. Implementing the transformer neural network in memory can limit the transfer of the weight values utilized by the transformer neural network. For example, instead of transferring the weight values across a host interface, the weight values can be accessed and utilized, local to a memory device, by a transformer neural network.

Implementing a transformer neural network in memory can also increase parallelism in training and inference utilizing the transformer neural network. For instance, computations utilized to train a transformer neural network and/or provide inference utilizing the transformer neural network can be performed using memory cells of a memory device. Utilizing the memory cells to perform computations can allow for multiple memory cells to be utilized to perform computations concurrently. The concurrent use of memory cells to perform computations can increase parallelism in providing inference and/or training a transformer neural network.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Analogous elements within a Figure may be referenced with a hyphen and extra numeral or letter. See, for example, elements 661-1, 661-2, 661-3, 661-4 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including a memory device 103 in accordance with a number of embodiments of the present disclosure. As used herein, a memory device 103, memory array 110, and/or a host 102, for example, might also be separately considered an "apparatus."

In this example, the computing system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 102. The computing system 100 can include separate integrated circuits, or both the host 102 and the memory device 103 can be on the same integrated circuit. For example, the host 102 may be a system controller of a memory system comprising multiple memory devices 103, with the system controller providing access to the respective memory devices 103 by another processing resource such as a central processing unit (CPU).

In the example shown in FIG. 1, the host 102 is responsible for executing an operating system (OS) and/or various applications that can be loaded thereto (e.g., from memory device 103 via control circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the computing system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although the memory array 110 is shown as a single memory array, the memory array 110 can represent a plurality of memory arrays arranged in banks of the memory device 103.

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z interconnect, cache coherent interconnect for accelerators (CCIX), or the like. Address signals are received and decoded by a row decoder 108 and a column decoder 112 to access the memory arrays 110. Data can be read from memory arrays 110 by sensing voltage and/or current changes on the sense lines using sensing circuitry 111. The sensing circuitry 111 can be coupled to the memory arrays 110. Each memory array and corresponding sensing circuitry can constitute a bank of the memory device 103. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory arrays 110 or read data from the memory arrays 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines coupling the memory array 110 to the I/O circuitry 107.

In various instances, the memory array 110 can be a resistive memory array. The resistive memory array can be a resistance programmable device. That is, the memory array 110 can be programmed utilizing the resistance of the memory cells that comprise the memory array 110. The resistance of the memory cells can be programmed to a specific resistance. The resistance of the memory cells can be used in the performance of operations. For instance, the resistance of the memory cells can be used in the performance of a multiplication operation by representing the values that are being multiplied, among other types of operations.

In various examples, the resistance of the memory cells can be programmed to represent weight values of the transformer neural network. The ability to program the resistance of the memory cells can contribute to the ability to perform forward updates, backward updates, and weight updates utilizing a limited number of banks of the memory array 110. The ability to program the resistance of the memory cells can also contribute to regularization which includes a drop out scheme implemented utilizing a random number generator, such as a stochastic pulse generator. A drop out scheme can include refraining from propagating outputs of a layer of the network or refraining from processing inputs to a layer of the network. Layer normalization can also be applied after an attention layer and/or a feed forward layer. The layer normalization can be used to normalize the inputs of the attention layer and/or the feed forward layer. Normalization can be achieved using a mean and a variance of the summed inputs for each layer.

A transformer neural network can comprise a number of encoders and decoders. The encoders can receive an input and can provide an output to the decoders. The decoders can receive an input from the encoders and can provide an output. For example, the encoders can receive a phrase in a first language and the decoders can output the phrase in a second language wherein the transformer neural network is utilized to perform language translation, among other possible utilizations of the transformer neural network.

Each of the encoders can comprise a self-attention layer and a feed forward network. Each of the decoders can comprise a self-attention layer, an encoder-decoder attention layer, and a feed forward network. Each of the attention layers (e.g., self-attention layer and/or encoder-decoder attention layer) can be implemented by one or more banks of the memory array 110.

The transformer neural network can be traversed to generate an inference. Traversing the transformer neural network to generate an inference is described as forward updating. The transformer neural network can be forward updated in its entirety or a layer of the transformer neural network can be forward updated. The transformer neural network can also be traversed to train a number of weights of the transformer neural network to generate updated weights. For example, the transformer neural network can be backward cycled to train the transformer neural network. The weights of a plurality of layers of the transformer neural network can also be updated based on the updated weight values.

Figure 2:
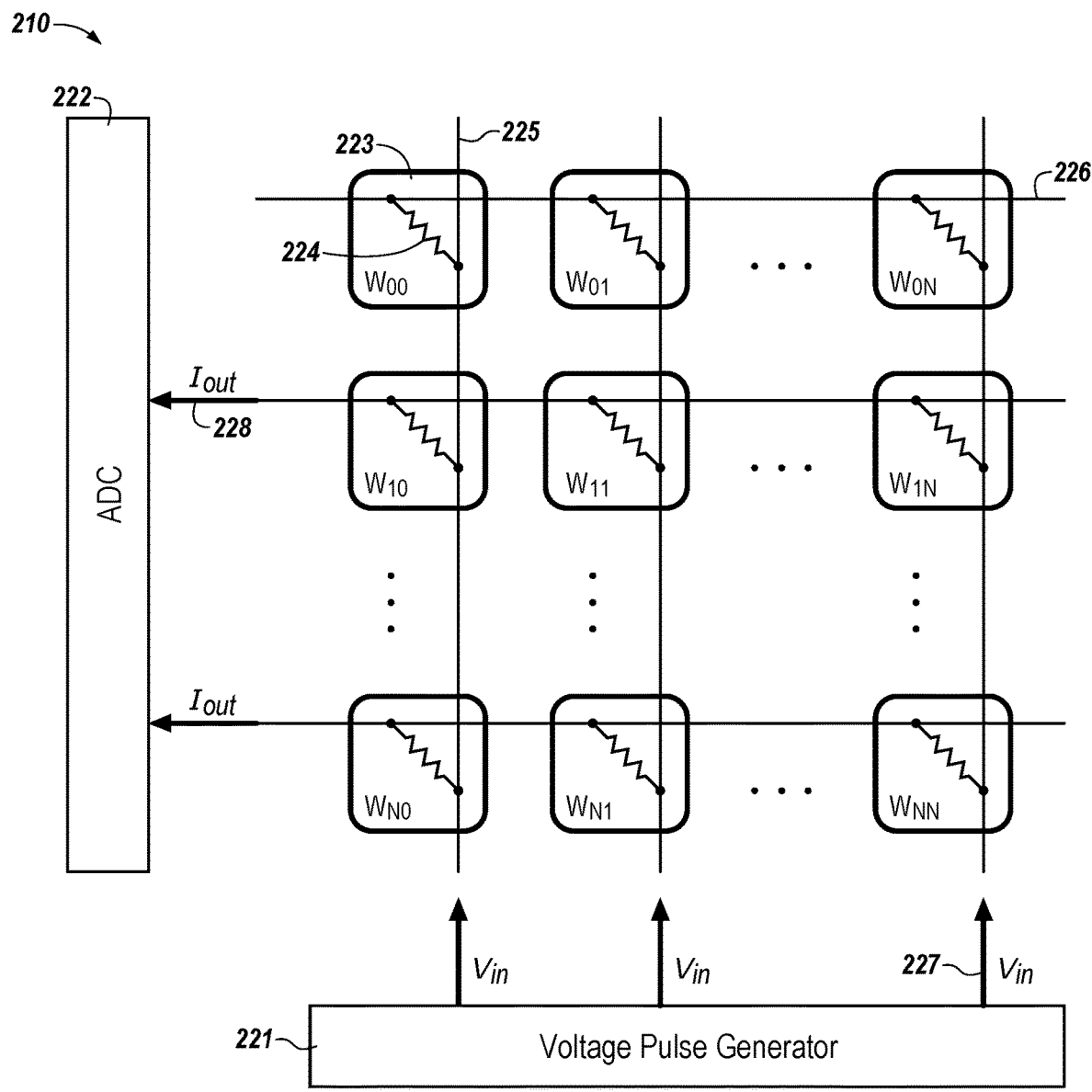
FIG. 2 illustrates an example memory array in accordance with a number of embodiments of the present disclosure.

FIG. 2 illustrates an example memory array 210 in accordance with a number of embodiments of the present disclosure. The memory array 210 comprises a plurality of memory cells 223. The memory cells 223 are coupled to various signal lines, such as sense lines 225 and access lines 226.

The memory cells 223 can be resistive memory cells 223. The resistive memory cells 223 can comprise terminals that couple the memory cells 223 to the sense lines 225 and the access lines 226. The terminals of the memory cells 223 can be coupled to each other via a resistive element 224. The resistive element 224 can be a resistance variable material (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistive memory cells 223 can include various materials employing trapped charges to modify or alter conductivity, chalcogenides formed of various doped or undoped materials, binary metal oxide materials, colossal magnetoresistive materials, and/or various polymer based resistive variable materials, among others. Embodiments are not limited to a particular resistance variable material or materials. The resistive elements 224 can control the conductance of the memory cells 223. In various instances, the conductance of the memory cells 223 can be programmed by programming the resistive element 224. For instance, control circuitry of a memory device can program the resistive element 224. As used herein, actions performed by a memory device, a memory array 210, the memory cells 224, the pulse generator 221 ("voltage pulse generator"), and/or the analog-to-digital converter 222 can be performed by a control circuitry of the memory device utilizing the memory device, the memory array 210, the memory cells 224, the pulse generator 221, and/or the analog-to-digital converter 222. The programming of the memory cells 223 is described further with respect to FIG. 4.

In a number of examples, the conductance and/or resistance of a memory cell 223 represents a weight value of a transformer neural network. With respect to programming the memory cells 223 and/or representing weight values with the memory cells 223, the terms resistance and conductance are used interchangeably herein since any change in resistance is accompanied by a proportional change in conductance. The conductance of the memory cells 223 can represent weight values of a layer of the transformer neural network. For instance, the conductance of the memory cells 223 can represent a weight of a self-attention layer of an encoder of a transformer neural network. As used herein, the terms weights and weight values are used interchangeably.

The memory cells 223 can be used to perform a plurality of operations. The memory cells 223 can be controlled to perform matrix multiplication in parallel and locally to the memory device hosting the memory array 210. Matrix multiplication can be performed utilizing inputs 227 and a plurality of weight values. The inputs 227 can be provided as an input vector. The plurality of weight values can be provided as a weight matrix and is stored by programming the memory cells 223 accordingly prior to applying the inputs 227. The resistances of the memory cells 223 collectively represent the weight matrix. The inputs 227 are denoted in FIG. 2 as $V_{in}$. $V_{in}$ can comprise the vector $$\begin{bmatrix} x_0 \\ \vdots \\ x_n \end{bmatrix}.$$

Each of the inputs (e.g., $x_0, \ldots, x_n$) can be provided to the memory array 210 via a plurality of signal lines such as the sense lines 225 or the access lines 226. FIG. 2 shows the inputs 227 as being provided via the sense lines 225. Each of the sense lines 225 can provide a portion of the input. For example, a first sense line can provide the input value $x_0, \ldots,$ and a last sense line can provide the input value $x_n$, wherein n is equal to a quantity of sense lines 225 or is less than the quantity of sense lines 225. The inputs 227 are provided by a pulse generator 221.

The inputs 227 can be multiplied with a weight matrix comprising the weight values stored by the memory array 210 and which are represented in the conductance of the memory cells 223. The weight matrix is denoted as $$\begin{bmatrix} w_{00} & \cdots & w_{0n} \\ \vdots & \ddots & \vdots \\ w_{n0} & \cdots & w_{nn} \end{bmatrix}.$$

Each of the memory cells 223 can store a different weight value represented by a conductance of a corresponding memory cell.

The outputs 228 (e.g., $I_{out}$) of the matrix multiplication can be provided as an output vector $$\begin{bmatrix} h_0 \\ \vdots \\ h_n \end{bmatrix}.$$

Figure 3:
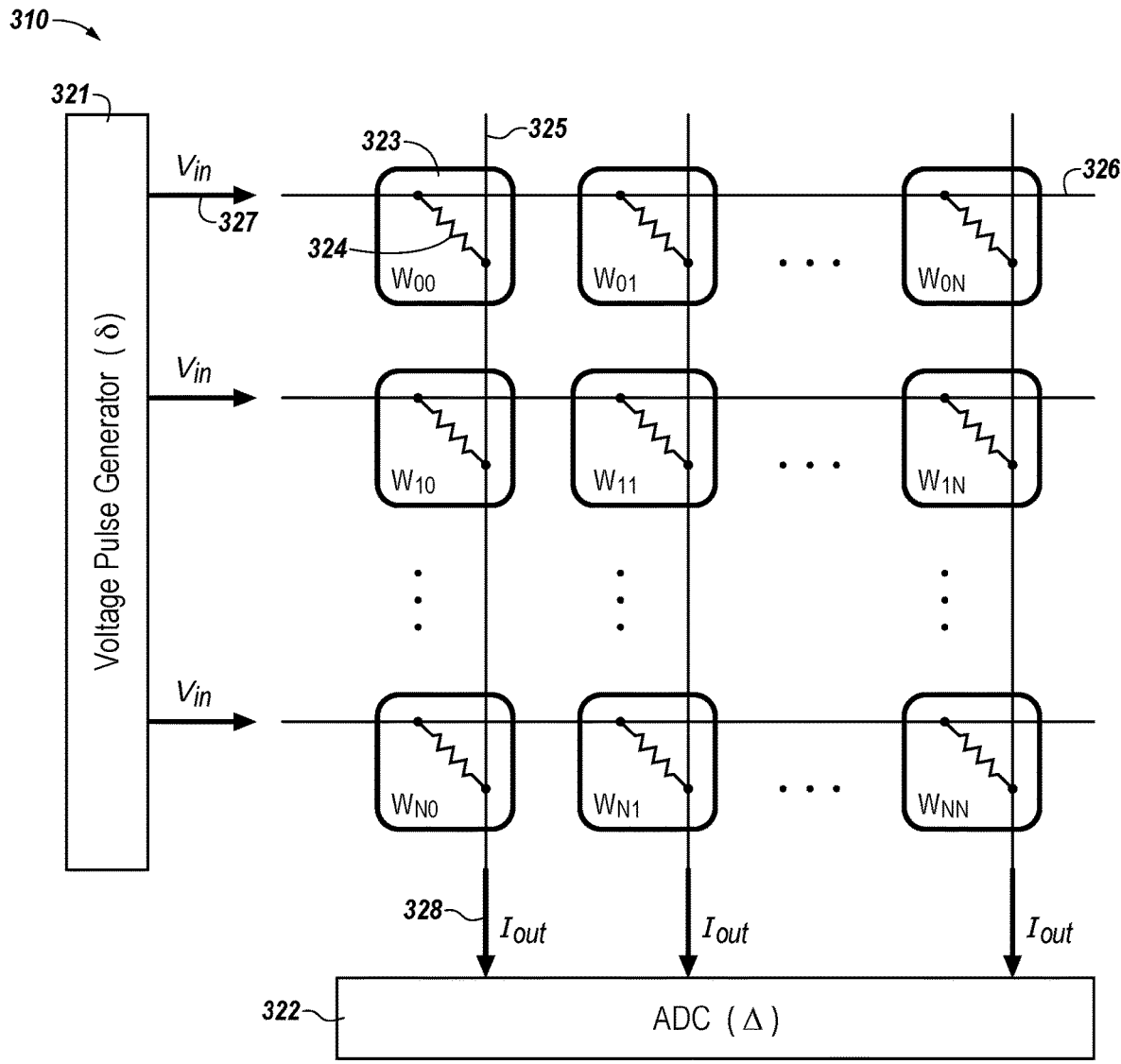
FIG. 3 illustrates an example memory array in accordance with a number of embodiments of the present disclosure.

Each of the outputs 228 (e.g., $h_0, \ldots, h_n$) can be provided via a different one of the signal lines such as the sense lines 225 or the access lines 226. FIG. 2 shows the outputs 228 as being provided via the access lines 226. Matrix multiplication is denoted as $$\begin{bmatrix} h_0 \\ \vdots \\ h_n \end{bmatrix} = \begin{bmatrix} w_{00} & \cdots & w_{0n} \\ \vdots & \ddots & \vdots \\ w_{n0} & \cdots & w_{nn} \end{bmatrix}^T \begin{bmatrix} x_0 \\ \vdots \\ x_n \end{bmatrix}.$$

or h=Wx, where h is the output comprising a vector including the individual $I_{out}$ values (in some embodiments after conversion to voltages by the analog-to-digital converter (ADC) 222), W is the weight matrix, and x is a vector including the individual inputs 227 (the $V_{in}$ values as illustrated in FIG. 2). In various examples, multiple instances of matrix multiplication can be performed using the memory array 210. A single instance of matrix multiplication can also be performed using the memory array 210. Although FIG. 2 shows operations as being performed by providing inputs 227 through the sense lines 225, the operations can also be performed by providing the inputs 227 through the access lines 226 as shown in FIG. 3.

The inputs 227 can be provided by a pulse generator 221 (e.g., voltage pulse generator). A pulse generator 221 can comprise hardware to generate a pulse, such as a voltage pulse. In various examples, the pulse generator 221 can receive one or more inputs, such as voltage inputs, and can generate one or more outputs in response thereto. In some examples, the pulse generator 221 can be a stochastic pulse generator, which is used as a random number generator. The pulse generator 221 can implement a drop out scheme which can be used along with the generation of random numbers to sample.

The outputs 228 can be current signals from the access lines 226. The outputs 228 can be provided to an ADC 222. The ADC 222 can receive a current as input and can output a voltage. The ADC can measure the current provided by the access lines 226. The output of the ADC 222 can be a voltage signal indicative of a state that can be stored in registers of the memory device or which can be provided directly to a pulse generator coupled to a different memory array or a same memory array pending reprogramming of the memory array 210.

For example, the memory array 210 can be used to generate an output which can be converted to a voltage signal by the ADC 222. The voltage signal can be indicative of a state that can be stored in registers of the memory device. The memory array 210 can then be reprogramed by resetting the conductance of the memory cells 223. Resetting the conductance of the memory cells 223 can reprogram the memory array 210 to function as a different layer of the transformer neural network. The output stored in the registers can be provided as an input to the pulse generator 221 which can provide an input 227 to the memory array 210.

In various instances, the memory array 210 can be used to generate an output which can be converted to a voltage signal by the ADC 222. The voltage signal can be provided directly to a different layer of the network. The different layer of the network can include a different pulse generator or the pulse generator 221 coupled to a different memory array. For example, the different memory array can be used to perform additional operations.

FIG. 2 shows the operation of the memory array 210 to implement a layer of a transformer neural network. Multiple layers of the transformer neural network can be implemented to forward update the transformer neural network which can result in the generation of an inference. The transformer neural network can also be forward updated to prepare for the implementation of backward cycles as described with respect to FIG. 3.

FIG. 3 illustrates an example memory array 310 in accordance with a number of embodiments of the present disclosure. FIG. 3 shows a back cycle of a layer of a transformer neural network. FIG. 3 shows a memory array 310 comprising a plurality of memory cells 323 coupled to signal lines such as sense lines 325 and access lines 326. The memory cells 323 comprise resistive elements 324.

In FIG. 3, the inputs 327 are provided via the access lines 326 from a pulse generator 321 (e.g., voltage pulse generator). The pulse generator 321 can receive one or more voltage signals and can generate a plurality of voltage pulses from the one or more voltage signals. The voltage pulses can be provided to the memory array 310 as an input 327.

The voltage input 327 can be applied to the resistive elements 324 of the memory cells 323. Based on the conductance of the resistive elements 324 (e.g., the weight value programmed thereto) and the voltage input 327 via the access line 326, the memory cells 323 can provide current through the sense lines 325 as an output 328 of the memory array 310. The ADC 322 can receive the output 328 as a current and can generate a voltage from the current.

The backward cycles are different from the forward updates because in the forward updates the inputs are provided via a first signal line and the outputs are provided via a second signal line while in backward cycles the inputs are provided via the second signal lines and the outputs are provided via the first signal lines. For example, in the forward updates the inputs are provided via the sense lines while in the backward cycle the inputs 327 are provided via the access lines 326. In the forward updates the outputs are provided via the access lines while in the backward cycles the outputs 328 are provided via the sense lines 325. Signal lines used to receive an input in a forward update can be used to provide an output in the backward cycles. Different signal lines used to provide an output in a forward update can also be used to receive an input in the backward cycles. The specific type of signal lines used to receive inputs for the forward updates can be sense lines or access lines. The type of signal lines used to receive the inputs for the backward cycles can be a different type of signal line (e.g., access lines) than was used to receive inputs for the forward updates.

With respect to the backward cycles, the inputs 327 are designated as δ and the weight values of the memory array 310 are designated as W. The outputs 328 are designated as Δ which represents a difference, such as a difference between the calculated h from the previous feed forward layer and an idealized h. The memory device thereby performs the computation $\Delta=W^T\delta$. The outputs 328 of a backward cycle of a particular layer can be provided as inputs to a different layer also performing backward cycles. In general, the feed forward layers and backward cycles do not update the weights stored in the memory cells.

Figure 4:
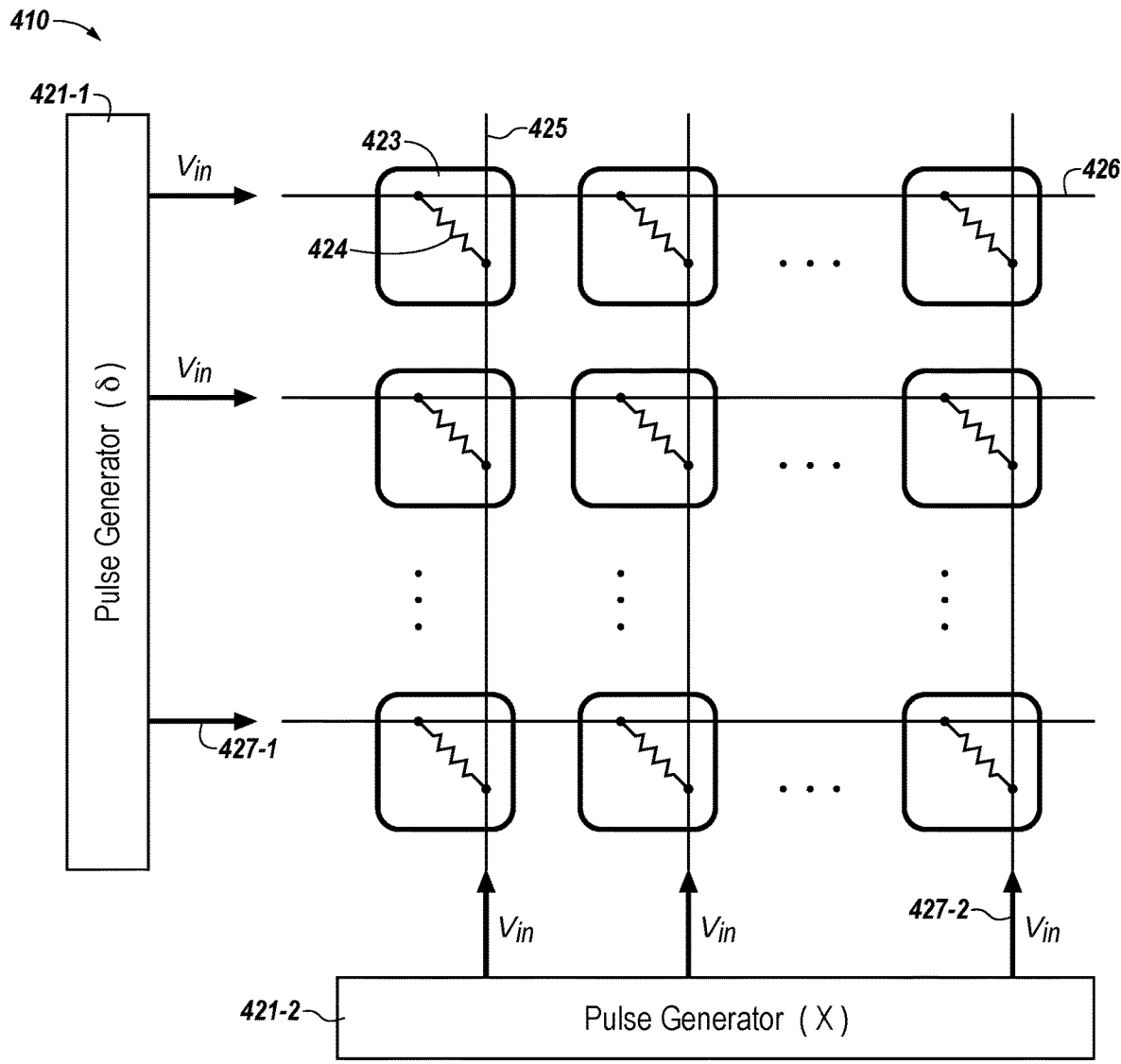
FIG. 4 illustrates an example memory array in accordance with a number of embodiments of the present disclosure.

FIG. 4 illustrates an example memory array 410 in accordance with a number of embodiments of the present disclosure. The memory array 410 comprises a plurality of memory cells 423 coupled to a plurality of signal lines, such as sense lines 425 and a plurality of access lines 426.

FIG. 4 provides an example of updating the weights of the memory cells 423. The weights are updated by programming the resistive elements 424 of the memory cells 423. The resistive elements 424 can be programmed by providing inputs 427-1, 427-2 through the sense lines 425 and the access lines 426, respectively. For instance, the inputs 427-1 are provided through the access lines 426 and the inputs 427-2 are provided through the sense lines 425.

The inputs 427-1 are voltage pulses denoted as δ. The inputs 427-2 are voltage pulses denoted as x. Providing the inputs 427-1, 427-2 can cause the memory array 410 to further program the memory cells 423 by updating the resistive elements 424 according to W* where $W^*=W+\eta(\delta x^T)$. W represents the weights stored in the memory cells 423 by their respective conductance prior to updating the resistive elements 424. η represents a constant. T represents the transposing of a vector such as x. Transposing includes creating a row vector if the vector being transposed is a column vector. Transposing can also include creating a column vector if the vector being transposed is a row vector. Transposing the vector x can include applying the x vector to the columns or rows. The multiplication and the addition are effectively performed by the memory device. The memory array 410 already stores W by the conductance of the memory cells 423. The additional programming "adds" the $\eta(\delta x^T)$ term to W. δ and $x^T$ are effectively multiplied by virtue of being applied simultaneously as inputs 427-1, 427-2 to the memory cells 423 as part of the programming operation to update the weight. $x^T$ indicates the transpose of the x vector. The transpose is effectively carried out by the control circuitry before the inputs 427-2 are applied, so that the inputs 427-2 are applied to the desired memory cells 423 after the transpose. The resulting conductance of the resistive elements 424 after the inputs 427-1, 427-2 are applied represents W*. The inputs 427-1 are provided by a pulse generator 421-1 and the inputs 427-2 are provided by a pulse generator 421-2.

Figure 5:
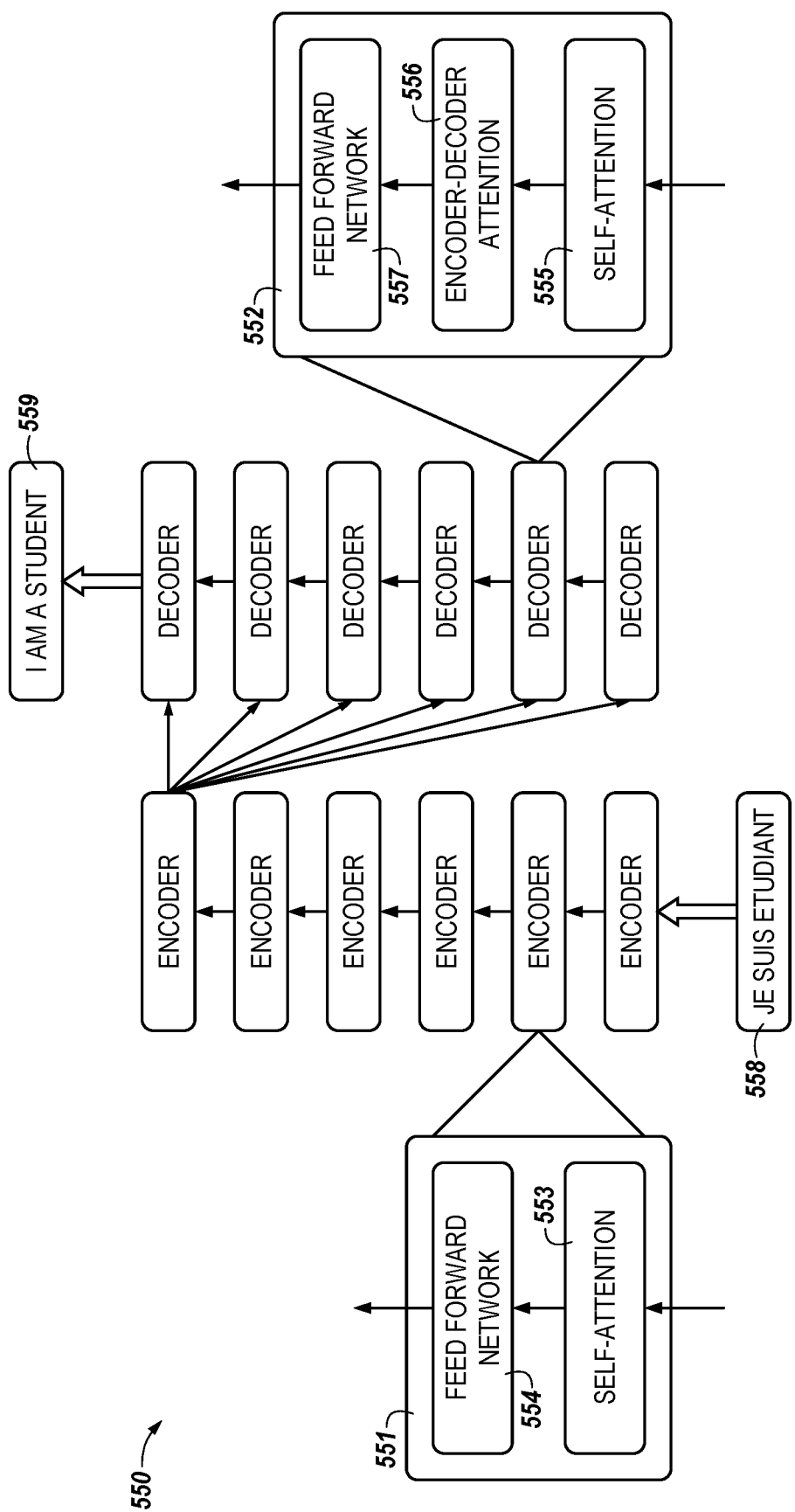
FIG. 5 is a block diagram of a transformer neural network in accordance with a number of embodiments of the present disclosure.

FIG. 5 is a block diagram of a transformer neural network 550 in accordance with a number of embodiments of the present disclosure. The transformer neural network 550 comprises a plurality of encoders 551 and a plurality of decoders 552. Each of the encoders 551 comprises a self-attention layer 553 and a feed forward network layer 554. Each of the decoders 552 comprises a self-attention layer 555, an encoder-decoder attention layer 556, and a feed forward network layer 557.

The transformer neural network 550 can receive an input 558 and can generate an output 559. The input 558 is embedded by the first sequential encoder. The output of the first sequential encoder is passed to a subsequent encoder as an input and this input/output process continues serially. The inputs between the encoders 551 do not necessarily correspond to meaningful information as does the original input 558. For example, where the original input 558 is a French phrase "je suis etudiant," the inputs between the encoders 551 (after the first encoder) do not necessarily correspond to French or English words. The inputs are vectors as described in more detail below.

FIG. 5 shows the encoders 551 are comprising a stack of six layers wherein each of the encoders 551 is a layer comprising additional layers such as the self-attention layer 553 and the feed forward network 554. Although six encoders 551 and six decoders 552 are shown, different embodiments can implement more or fewer encoders and decoders than the six encoders 551 and decoders 552 shown in FIG. 5.

The self-attention layer 553 can comprise a multi-headed self-attention layer. The feed forward network layer 554 can comprise a fully connected feed-forward network. Each of the sub-layers (e.g., the self-attention layer 553, and the feed forward network 554) can implement a residual connection and a layer normalization.

Each of the decoders 552 comprises three sub-layers: two sub-layers of multi-headed attention layers (e.g., the encoder-decoder attention layer 556 and the self-attention layer 555) and a fully-connected feed-forward network 557. Each of the sub-layers (e.g., the self-attention layer 555, the encoder-decoder attention layer 556, and the feed forward network layer 557) can implement a residual connection and a layer normalization. The self-attention layer 555 can be modified to prevent positions from attending to subsequent positions. A self-attention layer 555 can help the encoder 551 look at other words in the input sentence as it encodes a specific word. Preventing positions from attending to subsequent positions can prevent "looking into" the future of the target sequence when predicting the current position. The result of a last encoder in the sequence of encoders 551 can provide an output to each of the decoders 552. That output and the outputs between the decoders 552 do not necessarily correspond directly to meaningful information as does the final output 559. For example, where the final output 559 is an English phrase "I am a student," the outputs between the decoders 552 (other than the last decoder) do not necessarily correspond to French or English words.

Figure 6:
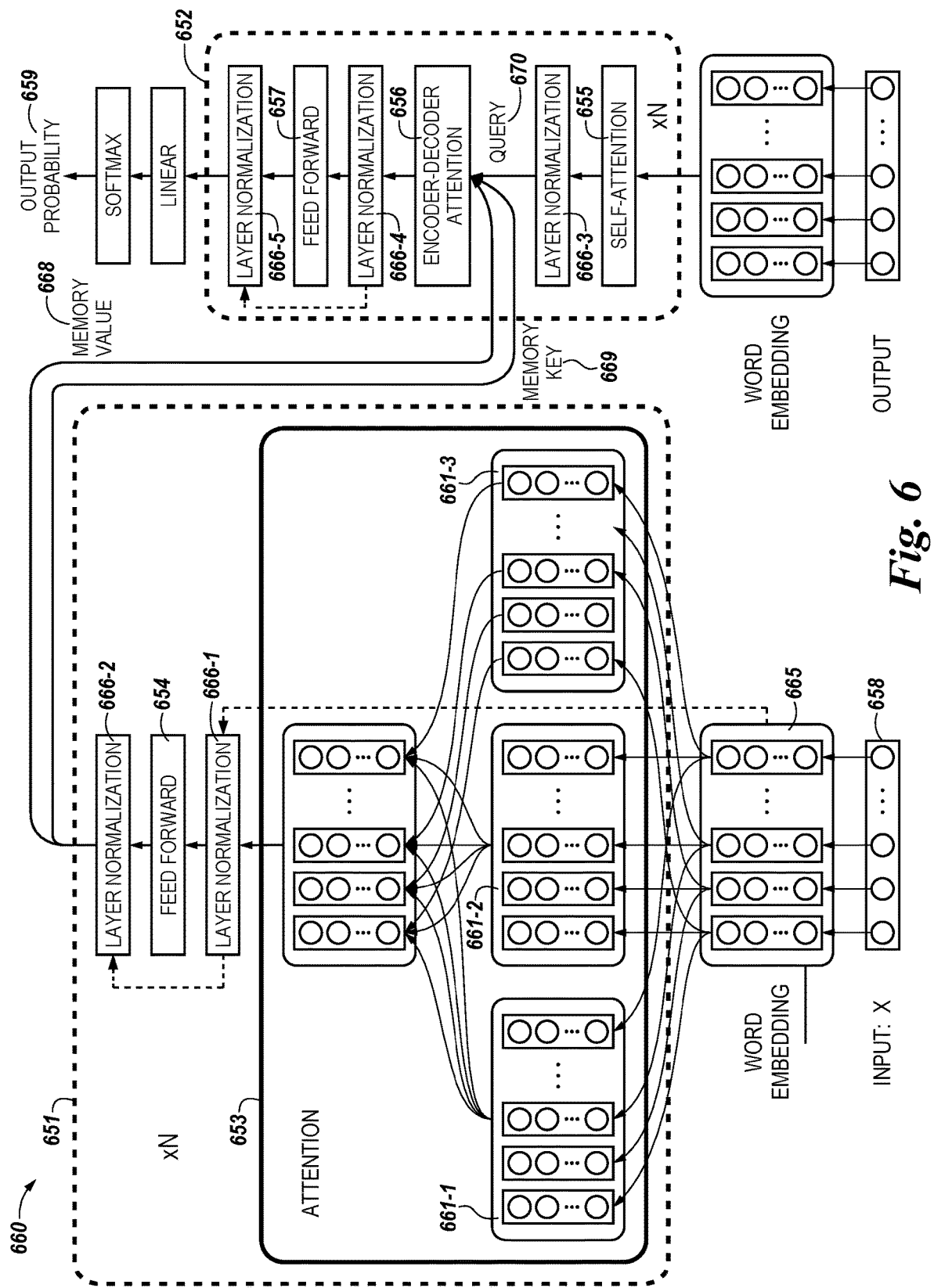
FIG. 6 is a block diagram of a transformer neural network in accordance with a number of embodiments of the present disclosure.

FIG. 6 is a block diagram of a transformer neural network 660 in accordance with a number of embodiments of the present disclosure. The transformer neural network 660 shows an encoder 651 and a decoder 652. Although a single encoder 651 and a single decoder 652 are shown in FIG. 6, the encoder 651 and the decoder 652 are representative of a plurality of encoders 551 and decoders 552 as shown in FIG. 5.

The encoder 651 is shown as having a self-attention layer 653. The decoder 652 is shown as having a self-attention layer 655 and an encoder-decoder attention layer 656. A computation flow of the self-attention layer 653 is shown as being performed utilizing a plurality of banks 661-1, 661-2, 661-3. Although the computation flow of the self-attention layer 655 and the encoder-decoder attention layer 656 is not shown, the self-attention layer 655 and the encoder-decoder attention layer 656 can be implemented similarly to the implementation of the self-attention layer 653. For example, a computation flow for each of the self-attention layers 655 and/or the encoder-decoder attention layers 656 can be performed using a plurality of banks.

The input 658 can be provided to a word embedder 665. The input 658 can be a vector (e.g., input vector) and/or can be a plurality of vectors. The word embedder 665 can map discrete categorical variables to a vector of continuous values. The embedder 665 can create three vectors from each of the encoder's input vectors. For example, the word embedder 665 can generate query vectors, key vectors, and value vectors. These vectors are created by multiplying the embedding by three matrices that were trained during a training process.

Each of the query vectors, key vectors, and value vectors can be processed by the memory device (e.g., the memory device 703 of FIG. 7) using different banks of a memory array. For instance, the query vectors can be processed by the memory device using the bank 661-1, the key vectors can be processed by the memory device using the bank 661-2, and the value vectors can be processed by the memory device using the bank 661-3. The memory device can process the query vectors concurrently with the processing of the key vectors and the value vectors using the banks 661. As used herein, attention layers can be designated as self-attention layers if the query vectors, the key vectors, and the value vectors are received from a single source. The encoder-decoder attention layer 656 is designated as "encoder-decoder" given that the key vectors and the value vectors are received from the encoder 651 while the query vectors are received from a separate source such as the normalization layer 666-3.

The results of the self-attention layer 653 can be normalized by a normalization layer 666-1. The normalized results can be provided to a feed forward network 654. The feed forward network 654 can be a fully connected feed-forward network. The results of the feed forward network 654 can be provided to the normalization layer 666-2. The normalization layer 666-2 can output the value vectors 668 and the key vectors 669 to the decoder 652. However, the encoder 651 can provide intermediary values (e.g., vectors) to different encoders until a last encoder has generated the value vectors 668, and the key vectors 669. The last encoder can provide the value vectors 668, and the key vectors 669 to each of a plurality of encoders.

The decoder 652 can receive the value vectors 668 and the key vectors 669. For example, the value vectors 668 and the key vectors 669 can be made available to the decoder 652 via registers of the memory device. For example, the output of the encoder 651 can be stored in registers. The decoder 652 can receive the value vectors 668 and the key vectors 669 by accessing the value vectors 668 and the key vectors 669 from the registers. The decoder 652 can also receive an output of a different decoder. The decoder 652 can process the output of a different decoder using the self-attention layer 655 and the normalization layer 666-3 to generate the query vectors 670. The normalization layer 666-3 can normalize the output of the self-attention layer 655 and provide the query vectors 670 to the encoder-decoder attention layer 656. The decoder 652 can receive the value vectors 668, the key vectors 669, and the query vectors 670 from different sources. For example, the value vectors 668 and the key vectors 669 can be received from the encoder 651 while the query vectors 670 are provided by the normalization layer 666-3.

The result of the encoder-decoder attention layer 656 can be processed by the normalization layer 666-4. The normalization layer 666-4 can provide an output to the feed forward network 657. The feed forward network 657 can also be a fully connected network. The feed forward network 657 can provide an input to the normalization layer 666-5. The output of the normalization layer 666-5 can be an output of the decoder 652. The decoder 652 outputs a vector of floats (e.g., float variables).

The result of the decoder 652 can be provided to a linear layer and the result of the linear layer can be provided to the softmax layer which can generate an output for the transformer neural network. The linear layer can be a fully connected neural network that projects the vector produced by the stack of decoders into a logits vector. The logits vector can represent a score of unique words. The softmax layer generates probabilities from the scores provided by the linear layer. The word with the highest probability is chosen and provided as an output 659. As such, each of a plurality of words can be assigned a probability and the words with the highest probability can be selected as the output.

Figure 7:
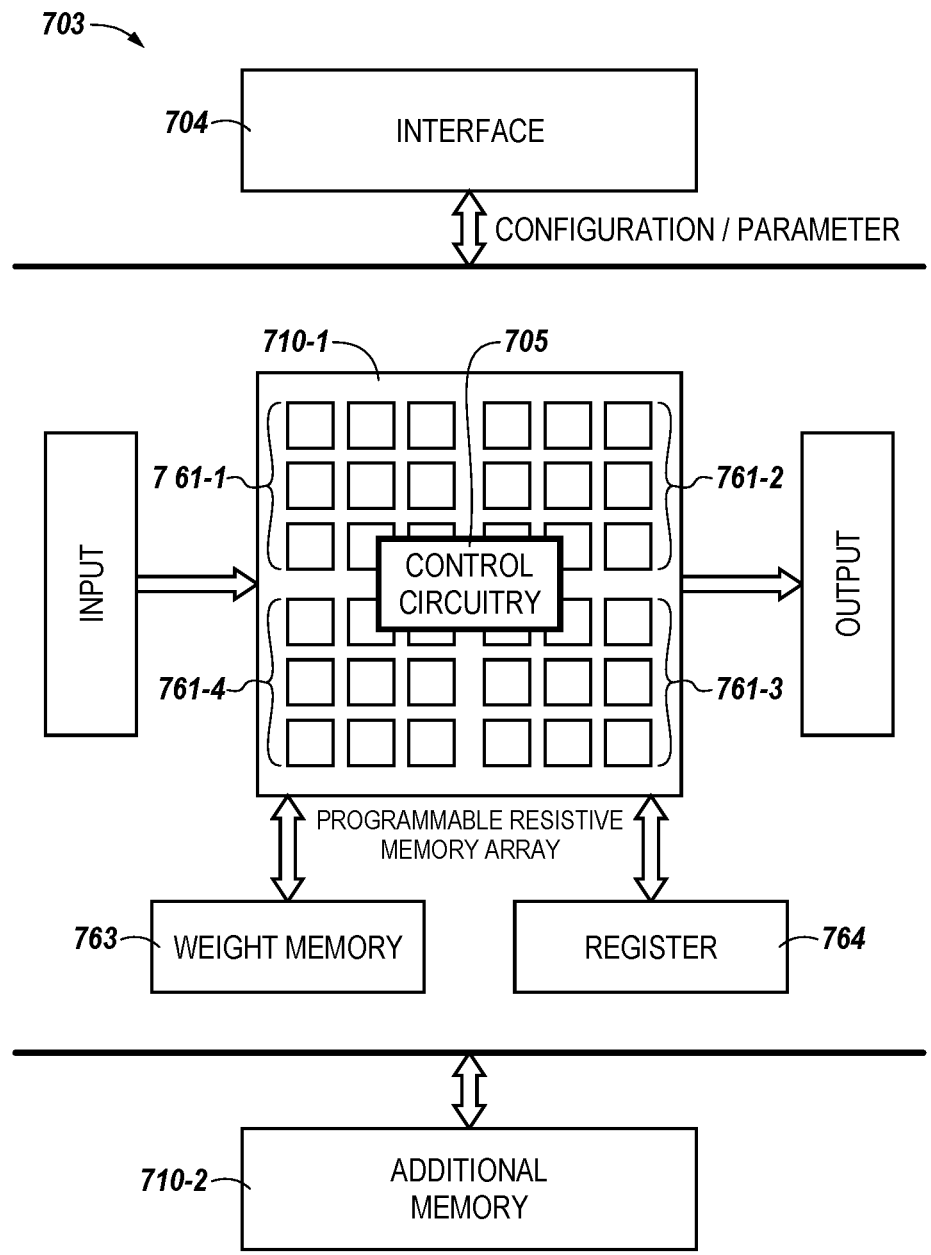
FIG. 7 is a block diagram of memory device implementing a layer of a transformer neural network in accordance with a number of embodiments of the present disclosure.

FIG. 7 is a block diagram of a memory device 703 implementing a layer of a transformer neural network in accordance with a number of embodiments of the present disclosure. The memory device 703 includes an interface 704, a memory array 710-1, additional memory 710-2, weight memory 763, and registers 764.

The interface 704 can be used to obtain configurations and/or parameters from a host. The configurations and/or parameters can include, for example, the weight values which can be used to set the resistive elements of the memory cells of the memory array 710-1. The configurations and/or parameters can be used to configure the memory array 710-1 into the transformer neural network. For example, the configurations and/or the parameters can be used to divide the memory array 710-1 into layer of the transformer neural network. The configurations and/or parameters can be used to configure the "size of the h block". Configuring the size of the h block can include configuring a size of the data stored in the registers of the hidden layers (e.g., hidden layers of encoders which comprises encoder-to-encoder layers), the number of encoders/decoders, among other possible configurations that are possible with the configurations and/or parameters.

The memory array 710-1 comprises a number of banks such as banks 761-1, 761-2, 761-3, 761-4. The banks 761-1, 761-2, 761-3, 761-4 can be referred to as banks 761. Each of the banks 761 can be used to perform one or more operations concurrently. For example, control circuitry 705 of the memory device 703 can process the query vectors using the bank 761-1. The control circuitry 705 can process the value vectors using the bank 761-3. The control circuitry 705 can process the key vectors using the bank 761-4. The query vectors, the value vectors, and the key vectors can be processed concurrently. The query vectors, the value vectors, and the key vectors can be processed as part of the implementation of the self-attention layer or an encoder-decoder attention layer.

The memory array 710-1 can implement a limited number of layers of a transformer neural network currently. For example, the memory array 710-1 can implement a self-attention layer of an encoder. To implement a different layer, the control circuitry 705 can store the result of the self-attention layer in the registers 764. The control circuitry 705 can store weight values corresponding to the self-attention layer in the weight memory 763. The control circuitry 705 can then retrieve a different set of weight values corresponding to a different layer of the transformer neural network. The control circuitry 705 can program the memory array 710-1 utilizing the different set of weight values. For example, the control circuitry 705 can program the conductance of the memory cells of the bank 761-1 to represent the retrieved weight values. The control circuitry 705 can then retrieve an input for the different layer from the registers 764. The control circuitry 705 can proceed to process the input utilizing the memory cells of the bank 761-1 having memory cells with a conductance representing the retrieved weight values. The control circuitry 705 can process the input utilizing the memory cells by applying the input to the memory cells which generates an output.

In some examples, a result of a layer of the transformer neural network can be provided as an input to a different layer of the transformer neural network without updating the weight values of a particular layer. For example, the memory array 710-1 can implement a first layer and a second layer concurrently utilizing the banks 761. The results of the first layer can be provided as an input to the second layer without updating the weight values of the bank implementing the second layer. In various instances, the output of the transformer neural network can be stored in the additional memory 710-2 or can be provided to a host via an I/O circuitry such as the I/O circuitry 107 of FIG. 1.

Figure 8:
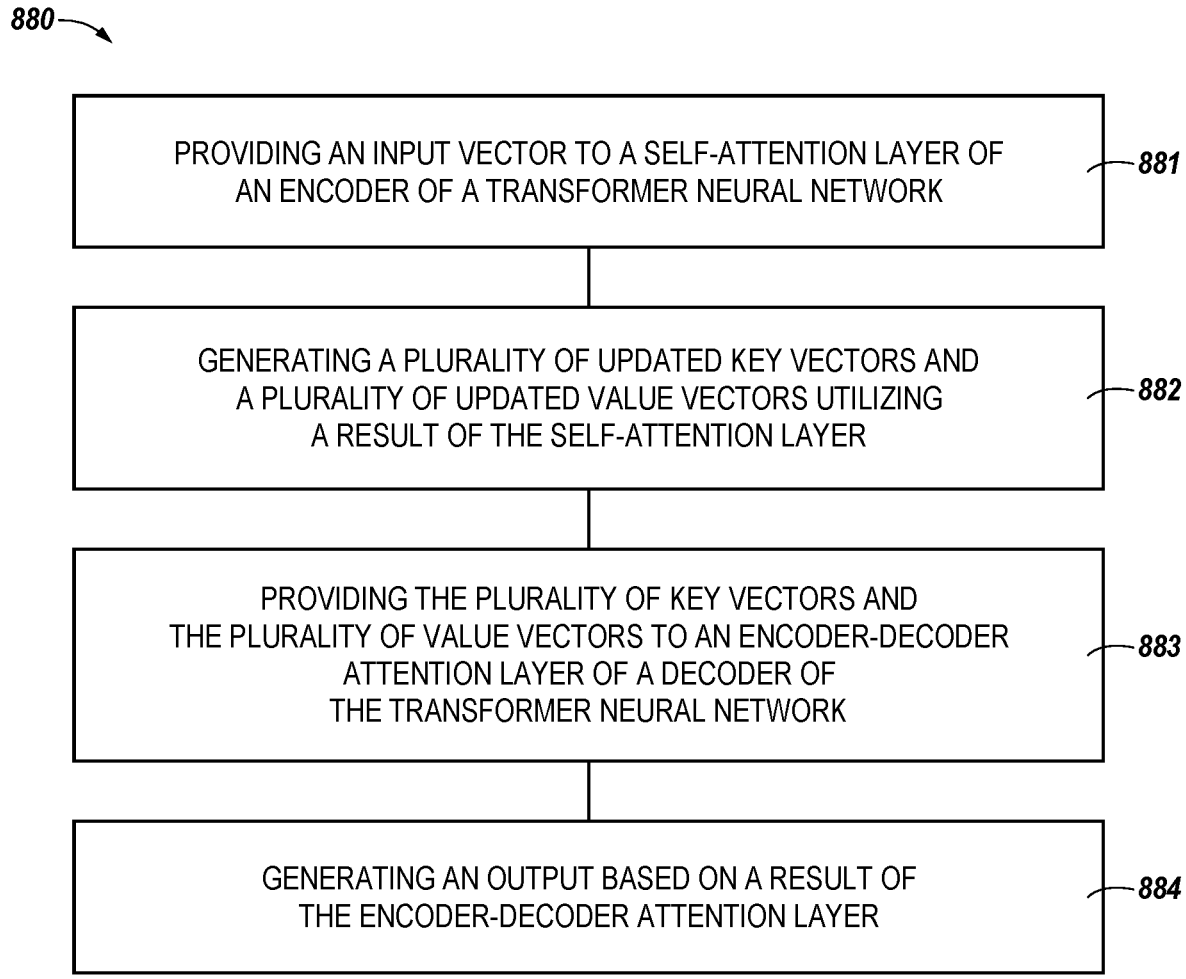
FIG. 8 illustrates an example flow diagram of a method for performing operations in memory in accordance with a number of embodiments of the present disclosure.

FIG. 8 illustrates an example flow diagram of a method 880 for performing operations in memory in accordance with a number of embodiments of the present disclosure. The method 880 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 880 is performed by the control circuitry (e.g., controller) 105 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 881, an input vector is provided to a self-attention layer of an encoder of a transformer neural network. At block 882, a plurality of updated key vectors and a plurality of updated value vectors can be generated utilizing a result of the self-attention layer. At block 883, the plurality of key vectors and the plurality of value vectors can be provided to an encoder-decoder attention layer of a decoder of the transformer neural network. At block 884, an output can be generated based on a result of the encoder-decoder attention layer.

The plurality of query vectors, the plurality of key vectors, and the plurality of value vectors can be accessed. The plurality of query vectors, the plurality of key vectors, and the plurality of value vectors can be obtained from registers of a memory device, from a host, and/or from a different layer of a transformer neural network.

The plurality of query vectors, the plurality of key vectors, and the plurality of value vectors can be processed in the self-attention layer of the encoder of the transformer neural network implemented in a plurality of banks of a memory device to generate the plurality of updated key vectors and the plurality of updated value vectors. Each of the plurality of query vectors, the plurality of key vectors, and the plurality of value vectors can be processed via the plurality of banks of the memory device by performing operations in the plurality of banks using a resistance of memory cells of the plurality of banks. The resistance of the memory cells can represent weights used to process the key vectors, the query vectors, and the value vectors.

The plurality of updated key vectors and the plurality of updated value vectors can be processed to generate an output probability via the decoder of the transformer neural network. In various examples, the plurality of updated key vectors and the plurality of updated value vectors can be processed to generate an output which can be provided to a different layer implemented using the same plurality of banks.

The plurality of query vectors, the plurality of key vectors, and the plurality of value vectors can be processed concurrently. The plurality of query vectors, the plurality of key vectors, and the plurality of value vectors can be processed concurrently because the processing is performed by the memory cells of a plurality of banks. Each of the plurality of query vectors, the plurality of key vectors, and the plurality of value vectors can be performed using different banks from the plurality of banks.

The plurality of updated key vectors and the plurality of updated value vectors can be processed using the encoder-to-decoder attention layer of the decoder and the plurality of banks of the memory device. For example, the plurality of banks can be configured to implement an encoder-to-decoder attention layer.

The plurality of updated key vectors and the plurality of updated value vectors can be stored in registers of the memory device to make the plurality of updated key vectors and the plurality of updated value vectors available to the plurality of banks. Making the updated key vectors and the updated value vectors available to the plurality of banks can include making the updated key vectors and the updated value vectors available to different layers of the transformer neural network.

In various instances, an application can comprise a memory array and a controller. The controller can be configured to implement a plurality of encoders using a first portion of a plurality of banks of the memory array. The controller can also be configured to implement a plurality of decoders using a second portion of the plurality of banks of the memory array wherein the plurality of encoders and the plurality of decoders are part of a transformer neural network.

The memory array can be a programmable resistive memory array. The controller can be configured to program the programmable resistive memory array by providing a plurality of voltage pulses to implement the plurality of encoders and the plurality of decoders. For example, the plurality of voltage pulses can be provided to program a resistive element of the memory device of one or more banks.

The controller can further be configured to forward update the plurality of encoders by providing an input via a plurality of first signal lines of the memory array. The first signal lines can be sense lines as shown in FIG. 2 or can be access lines.

The input to the plurality of encoders implemented in the first portion of the plurality of banks can be implemented as voltage pulses. The voltage pulses can be generated by pulse generators.

The plurality of encoders can be forward updated by providing an output via a plurality of second signal lines of the memory array. The second signal lines can be access lines as shown in FIG. 2. A current of the plurality of second signal lines is measured via an analog-to-digital converter. The analog-to-digital converter can be used to convert the measured current to an output voltage of a layer of one of the plurality of encoders. The output voltage can be provided as an input voltage to a different layer of the one of the plurality of encoders.

The transformer neural network can be trained using backward cycles by providing inputs via a plurality of second signal lines of the memory array. The outputs, of the backward cycles, can be provided via the plurality of first signal lines of the memory array.

The plurality of encoders and the plurality of decoders can be implemented by setting a respective resistance of the memory cells of the first portion and the second portion of the plurality of banks. Setting the respective resistance of the memory cells represents updating weights of the transformer network. The respective resistance can be set by providing inputs through a plurality of first signal lines and a plurality of second signal lines of the memory array.

The plurality of encoders can be implemented utilizing the first portion of the plurality of banks and the plurality of decoders can also be implemented utilizing the second portion of the plurality of banks wherein the first portion and the second portion are different portions of the plurality of banks. The plurality of encoders can also be implemented utilizing the first portion of the plurality of banks and the plurality of decoders can be implemented utilizing the second portion of the plurality of banks wherein the first portion and the second portion are a same portion of the plurality of banks.

In a different example, a self-attention layer of an encoder of a transformer neural network can be processed utilizing a plurality of banks of the memory device and a first plurality of weights and the first plurality of weights can be updated utilizing the plurality of registers.

A different self-attention layer of a different encoder of the transformer neural network can be processed utilizing the plurality of banks of the memory device and a second plurality of weights. The second plurality of weights can be updated utilizing the plurality of registers.

The first plurality of weights is further configured to store the first plurality of weights in a first portion of the plurality of registers. The controller can further be configured to retrieve the first plurality of weights from the first portion of the plurality of registers prior to processing the self-attention layer. The second plurality of weights can be retrieved from a second portion of the plurality of registers prior to processing the different attention-layer. The second plurality of weights can be updated in the second portion of the plurality of registers to update the second plurality of weights.

Figure 9:
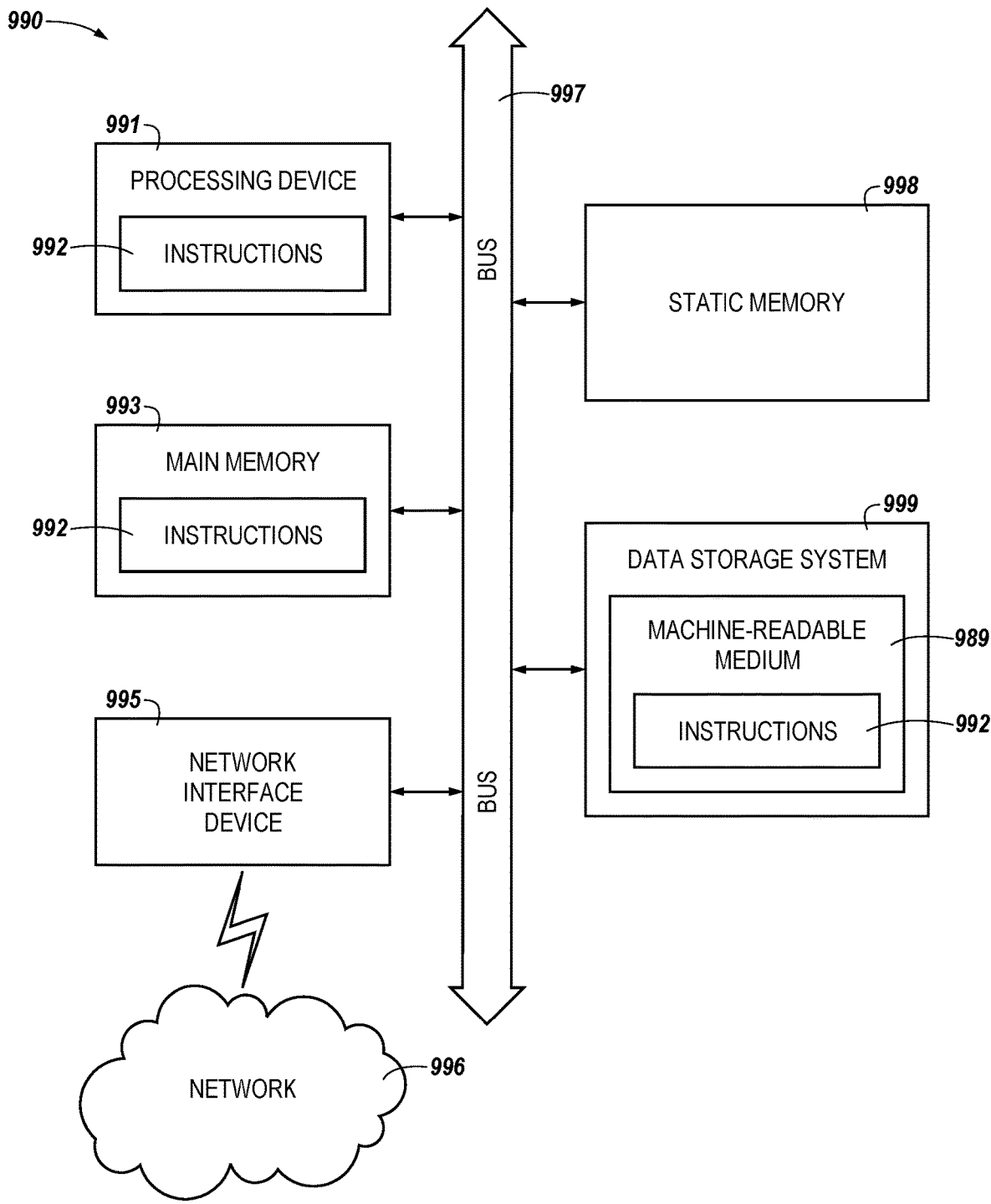
FIG. 9 illustrates an example machine of a computer system within which a set of instructions, for causing the machine to perform various methodologies discussed herein, can be executed.

FIG. 9 illustrates an example machine of a computer system 990 within which a set of instructions, for causing the machine to perform various methodologies discussed herein, can be executed. In various embodiments, the computer system 990 can correspond to a system (e.g., the computing system 100 of FIG. 1) that includes, is coupled to, or utilizes a memory sub-system (e.g., the memory device 103 of FIG. 1) or can be used to perform the operations of a controller (e.g., the controller circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 990 includes a processing device 991, a main memory 993 (e.g., read-only memory (ROM), flash memory, dynamic random access memory (DRAM) such as synchronous DRAM (SDRAM) or Rambus DRAM (RDRAM), etc.), a static memory 998 (e.g., flash memory, static random access memory (SRAM), etc.), and a data storage system 999, which communicate with each other via a bus 997.

Processing device 991 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 991 can also be one or more special-purpose processing devices such as an application specific integrated circuit (ASIC), a field programmable gate array (FPGA), a digital signal processor (DSP), network processor, or the like. The processing device 991 is configured to execute instructions 992 for performing the operations and steps discussed herein. The computer system 990 can further include a network interface device 995 to communicate over the network 996.

The data storage system 999 can include a machine-readable storage medium 989 (also known as a computer-readable medium) on which is stored one or more sets of instructions 992 or software embodying any one or more of the methodologies or functions described herein. The instructions 992 can also reside, completely or at least partially, within the main memory 993 and/or within the processing device 991 during execution thereof by the computer system 990, the main memory 993 and the processing device 991 also constituting machine-readable storage media.

In one embodiment, the instructions 992 include instructions to implement functionality corresponding to the host 102 and/or the memory device 103 of FIG. 1. While the machine-readable storage medium 989 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein, will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory array comprising a plurality of memory cells arranged into a plurality of banks; and
a controller coupled to the memory array and configured to:
implement a plurality of encoders using memory cells of a first portion of the plurality of banks of the memory array;
implement a plurality of decoders using memory cells of a second portion of the plurality of banks of the memory array, wherein the plurality of encoders and the plurality of decoders are part of a transformer neural network and wherein the memory cells of the first portion of the plurality of banks are different from the memory cells of the second portion of the plurality of banks; and
provide a result of the plurality of encoders of the first portion of the plurality of banks as an input to the plurality of decoders of the second portion of the plurality of banks without updating a resistance of the memory cells of the second portion of the plurality of banks,
wherein the result is generated in the memory cells of the first portion of the plurality of banks of the memory array, and
wherein the result is provided as an input to the plurality of decoders via a plurality of signal lines such that each signal line of the plurality of signal lines provides a portion of the input.

2. The apparatus of claim 1, wherein the memory array is a programmable resistive memory array and wherein the controller is further configured to program the programmable resistive memory array by providing a plurality of voltage pulses to implement the plurality of encoders and the plurality of decoders.

3. The apparatus of claim 1, wherein the controller is further configured to forward update the plurality of encoders by providing an input via a plurality of first signal lines of the memory array.

4. The apparatus of claim 3, wherein the controller is further configured to provide the input to the plurality of encoders implemented in the memory cells of the first portion of the plurality of banks as voltage pulses.

5. The apparatus of claim 3, wherein the controller is further configured to forward update the plurality of encoders by providing an output via a plurality of second signal lines of the memory array.

6. The apparatus of claim 5, wherein the controller is further configured to:
measure, via an analog-to-digital converter, a current of the plurality of second signal lines;
use the analog-to-digital converter to convert the measured current to an output voltage of a layer of one of the plurality of encoders; and
provide the output voltage as an input voltage to a different layer of the one of the plurality of encoders.

7. The apparatus of claim 1, wherein the controller is further configured to train the transformer neural network using backward cycles by providing inputs via a plurality of second signal lines of the memory array.

8. The apparatus of claim 7, wherein the controller is further configured to provide the outputs of the backward cycles via the plurality of first signal lines of the memory array.

9. The apparatus of claim 1, wherein the controller is further configured to:
implement the plurality of encoders and the plurality of decoders by setting a respective resistance of the memory cells of the first portion and the second portion of the plurality of banks,
wherein setting the respective resistance of the memory cells represents updating weights of the transformer network.

10. The apparatus of claim 9, wherein the controller is further configured to set the respective resistance by providing inputs through a plurality of first signal lines and a plurality of second signal lines of the memory array.

11. A method, comprising:
providing an input vector to a self-attention layer of an encoder of a transformer neural network implemented in a first plurality of memory cells of a plurality of banks of a memory device;
generating a plurality of updated key vectors and a plurality of updated value vectors in the first plurality of memory cells of the plurality of banks of the memory device utilizing a result of the self-attention layer;
providing the plurality of updated key vectors and the plurality of updated value vectors to an encoder-decoder attention layer of a decoder of the transformer neural network implemented in a second plurality of memory cells of the plurality of banks of the memory device,
wherein the plurality of updated key vectors and the plurality of updated value vectors are provided to the encoder-decoder attention layer of the decoder by direct transfer from the first plurality of memory cells to the second plurality of memory cells,
wherein the plurality of updated key vectors and the plurality of updated value vectors are provided as an input to the encoder-decoder attention layer of the decoder via a plurality of signal lines such that each signal line of the plurality of signal lines provides a portion of the input,
wherein the first plurality of memory cells is different from the second plurality of memory cells,
wherein the plurality of updated key vectors and the plurality of updated value vectors are provided to the encoder-decoder attention layer without updating the resistance of the second plurality of memory cells, and
wherein the first plurality and second plurality of memory cells are implemented on different banks of the memory device; and
generating an output based on a result of the encoder-decoder attention layer.

12. The method of claim 11, further comprising:
processing a plurality of query vectors, a plurality of key vectors, and a plurality of value vectors in the self-attention layer of an encoder of a transformer neural network implemented in the memory cells of the plurality of banks of the memory device to generate the plurality of updated key vectors and the plurality of updated value vectors,
wherein the plurality of query vectors, the plurality of key vectors, and the plurality of value vectors are processed concurrently, wherein the plurality of query vectors, the plurality of key vectors, and the plurality of value vectors are processed using a resistance of the memory cells of the plurality of banks, and wherein the processing of each of the plurality of query vectors, the plurality of key vectors, and the plurality of value vectors is performed using different banks from the plurality of banks.

13. The method of claim 12, further comprising processing the plurality of updated key vectors and the plurality of updated value vectors using an encoder-to-decoder attention layer of the decoder and the plurality of banks of the memory device.

14. The method of claim 12, further comprising storing the plurality of updated key vectors and the plurality of updated value vectors in registers of the memory device to make the plurality of updated key vectors and the plurality of updated value vectors available to the plurality of banks.

15. A system, comprising:
a memory device;
a plurality of registers; and
a controller coupled to the memory device and the plurality of registers and configured to:
process a self-attention layer of an encoder of a transformer neural network utilizing a first plurality of memory cells of a plurality of banks of the memory device and a first plurality of weights;
process a different self-attention layer of a different encoder of the transformer neural network utilizing a second plurality of memory cells of the plurality of banks of the memory device and a second plurality of weights,
wherein the first plurality of memory cells are different from the second plurality of memory cells,
wherein a result of the self-attention layer is provided as an input to the different self-attention layer without updating a resistance of the second plurality of memory cells,
wherein the result of the self-attention layer is provided as an input to the different self-attention layer by direct transfer from the first plurality of memory cells to the second plurality of memory cells,
wherein the result of the self-attention layer is provided as an input to the different self-attention layer via a plurality of signal lines such that each signal line of the plurality of signal lines provides a portion of the input,
wherein the result of the self-attention layer is generated in the first plurality of memory cells of the plurality of banks of the memory device, and
wherein the first plurality and second plurality of memory cells are implemented on different banks of the memory device; and
update the first plurality of weights and the second plurality of weights utilizing the plurality of registers.

16. The system of claim 15, wherein the controller configured to update the first plurality of weights is further configured to store the first plurality of weights in a first portion of the plurality of registers.

17. The system of claim 15, wherein the controller is further configured to retrieve the first plurality of weights from the first portion of the plurality of registers prior to processing the self-attention layer.

18. The system of claim 15, wherein the controller is further configured to:
retrieve the second plurality of weights from a second portion of the plurality of registers prior to processing the different self-attention layer and
store the second plurality of weights in the second portion of the plurality of registers to update the second plurality of weights.

* * * * *